(12) United States Patent
Shako et al.

(10) Patent No.: US 7,711,069 B2
(45) Date of Patent: May 4, 2010

(54) DISTORTION-COMPENSATION AMPLIFICATION APPARATUS AND DISTORTION COMPENSATION METHOD

(75) Inventors: Hideharu Shako, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/206,058

(22) Filed: Sep. 8, 2008

(65) Prior Publication Data

US 2009/0140806 A1 Jun. 4, 2009

(30) Foreign Application Priority Data

Dec. 4, 2007 (JP) .............................. 2007-313223

(51) Int. Cl.
*H04L 25/49* (2006.01)
*H03K 7/00* (2006.01)
(52) U.S. Cl. ........................................ 375/296; 332/107
(58) Field of Classification Search ................. 375/285, 375/295–297; 455/91, 114.2; 332/123–125, 332/149, 159, 160, 161, 107
See application file for complete search history.

(56) References Cited

U.S. PATENT DOCUMENTS

| 7,447,274 | B2 * | 11/2008 | Shako et al. ................. 375/296 |
| 2003/0022639 | A1 * | 1/2003 | Hongo et al. ............... 455/116 |
| 2003/0058959 | A1 * | 3/2003 | Rafie et al. .................. 375/296 |
| 2004/0136395 | A1 | 7/2004 | Itahara et al. |
| 2005/0141639 | A1 * | 6/2005 | Anvari ......................... 375/296 |
| 2005/0243909 | A1 | 11/2005 | Itahara et al. |
| 2006/0171486 | A1 * | 8/2006 | Tan ............................. 375/296 |
| 2006/0209983 | A1 * | 9/2006 | Shako et al. ................. 375/296 |
| 2006/0217088 | A1 * | 9/2006 | Nagaoka et al. ........... 455/127.1 |

FOREIGN PATENT DOCUMENTS

| JP | 2002-44054 | 2/2002 |
| JP | 2002-164799 | 6/2002 |
| JP | 2004-64711 | 2/2004 |
| JP | 2006-270246 | 10/2006 |

\* cited by examiner

*Primary Examiner*—Tesfaldet Bocure
(74) *Attorney, Agent, or Firm*—Katten Muchin Rosenman LLP

(57) ABSTRACT

Distortion-compensation amplification apparatus that can obtain an appropriate error vector magnitude without increasing power consumption and can suppress the distortion of a transmission signal appropriately. A distortion compensation section applies distortion compensation to the transmission signal. An amplification section amplifies the transmission signal to which distortion compensation has been applied by the distortion compensation section. A frequency component calculation section calculates the power of frequency components of the transmission signal amplified by the amplification section. A peak suppression section suppresses the peak value of the transmission signal input to the distortion compensation section in accordance with the power of the frequency components calculated by the frequency component calculation section.

9 Claims, 13 Drawing Sheets

DISTORTION-COMPENSATION AMPLIFICATION APPARATUS AND DISTORTION COMPENSATION METHOD

CROSS-REFERENCE TO RELATED APPLICATIONS

This application is based upon and claims the benefits of priority from the prior Japanese Patent Application No. 2007-313223, filed on Dec. 4, 2007, the entire contents of which are incorporated herein by reference.

BACKGROUND OF THE INVENTION

1. Field of the Invention

The present invention relates to distortion-compensation amplification apparatuses and distortion compensation methods, and particularly to a distortion-compensation amplification apparatus for compensating for distortion of a transmission signal and for amplifying and outputting the transmission signal and a distortion compensation method therefor.

2. Description of the Related Art

In wireless communication, high-efficiency transmission by digitalization has increased in recent years. What is important in wireless communication using a multilevel phase shift keying system is a technology for reducing adjacent channel leakage power by making the amplification characteristics of the transmitting power amplifier linear on the transmitter side such as a base station to suppress non-linear distortion. If an amplifier having poor power linear characteristics is used to improve the power efficiency, a technology for compensating for the resulting non-linear distortion is necessary (refer to Japanese Unexamined Patent Application Publication No. 2006-270246, for example).

A general distortion-compensation amplification apparatus performs peak suppression to suppress a distortion component (refer to Japanese Unexamined Patent Application Publication No. 2004-64711, for example). The peak suppression blocks the input of a signal not smaller than the saturation power, thereby compensating for distortion.

FIG. 10 illustrates the amplification characteristics of a distortion-compensation amplification apparatus. In the figure, the horizontal axis represents the input level of the signal input to the distortion-compensation amplification apparatus, and the vertical axis represents the output level of the signal output from the distortion-compensation amplification apparatus.

A waveform W101 in the figure represents ideal amplification characteristics of the distortion-compensation amplification apparatus. The relationship between the input signal and the output signal of the distortion-compensation amplification apparatus is desired to be linear as represented by the waveform W101, so that an amplified signal can be output without distortion.

A waveform W102 in the figure represents amplification characteristics of the distortion-compensation amplification apparatus when distortion compensation is not performed. As the waveform W102 indicates, the distortion-compensation amplification apparatus maintains linearity for the input signal up to a certain level and loses the linearity beyond the certain level. If a signal of a higher level is input, the distortion-compensation amplification apparatus is saturated in gain and outputs a signal of a uniform level (as represented by the flat part in the waveform W102).

A waveform W103 in the figure represents the relationship between the input level and output level of the distortion-compensation amplification apparatus when distortion compensation is performed. As described earlier, when distortion compensation is not performed, the amplification characteristics of the distortion-compensation amplification apparatus becomes non-linear for the input signal exceeding a certain level. The distortion-compensation amplification apparatus obtains linearity, as represented by the waveform W103, by raising the level of the input signal in the non-linear part of the amplification characteristics (the non-linear part of the waveform W102). To be more specific, the distortion-compensation amplification apparatus obtains a linear amplification characteristic such as that represented by the waveform W101, by multiplying the input signal by such a distortion compensation coefficient that the output signal becomes linear.

However, if a signal not smaller than the saturation point of the distortion-compensation amplification apparatus is input, an increased distortion compensation coefficient cannot increase the output signal beyond a certain level. This would cause the distortion compensation coefficient to be updated toward an infinite value and to diverge in the gain saturation part. Accordingly, the level of the input signal to the distortion-compensation amplification apparatus should not exceed a dotted line D101 in the figure, at most. This means that the distortion-compensation amplification apparatus should perform peak suppression so that the input signal will not exceed the level indicated by the dotted line D101 in the figure.

A dotted line D102 in FIG. 10 represents the operating point of the distortion-compensation amplification apparatus. The ratio of the operating point to the peak suppression point is referred to as a peak average rate (PAR).

FIG. 11 illustrates peak suppression. A dotted line D111 in the figure represents the peak suppression point. The value of the peak suppression point represented by the dotted line D111 is held to the value of the dotted line D101 in FIG. 10, for instance, so that the distortion compensation coefficient will not diverge.

If an input signal exceeds the peak suppression point, as represented by $X_1(t)$ in the figure, the distortion-compensation amplification apparatus performs peak suppression, as represented by $X_2(t)$ in the same figure. Through this processing, the distortion-compensation amplification apparatus prevents the distortion compensation coefficient from diverging.

A dotted line D112 in the figure represents the average power of the input signal $X_2(t)$. The distortion-compensation amplification apparatus is designed to set the average power of the input signal $X_2(t)$ as its operating point.

FIG. 12 shows the relationship between the error vector magnitude (indicating modulation precision) and the peak suppression point. In the figure, the horizontal axis represents the peak average rate (PAR), and the vertical axis represents the error vector magnitude (EVM).

As shown in the figure, an increase in peak average rate improves the EVM (error vector magnitude). A standard range of EVM is specified, and the peak suppression point must be set corresponding to γ or more in the shown example.

FIG. 13 illustrates adjacent channel leakage power. In the figure, the horizontal axis represents frequency, and the vertical axis represents power. In this figure, P101 to 104 represent the power of transmission carriers, and P111 to P114 represent adjacent channel leakage power.

A standard adjacent channel leakage power is specified. The leakage power must be −45 dB or lower at ±5 MHz from the transmission carrier frequency band and must be −50 dB or lower at ±10 MHz from the transmission carrier frequency band, for example.

However, the peak suppression, which changes the waveform of the transmission signal as shown in FIG. 11, may cause degradation in error vector magnitude. For instance, if a low peak suppression point is specified (if the dotted line D111 in FIG. 11 is lowered), the error vector magnitude would deteriorate to such a level that the EVM standard cannot be satisfied.

If a high peak suppression point is specified (the dotted line D101 is specified rightward in FIG. 10) to improve the error vector magnitude, the amount of distortion of the transmission signal would increase beyond the specifications of adjacent channel leakage power.

Accordingly, in a conventional distortion-compensation amplification apparatus, a margin of several decibels is provided between a gain saturation point (where the waveform W102 in FIG. 10 becomes flat) and a peak suppression point, in consideration of the temperature characteristics and the like. In other words, the flat part of the waveform W102 is raised to improve the linearity. This approach, however, increases power consumption.

SUMMARY OF THE INVENTION

In view of the foregoing, it is an object of the present invention to provide a distortion-compensation amplification apparatus that can provide an appropriate error vector magnitude without increasing power consumption and can suppress the distortion of the transmission signal and a distortion compensation method therefor.

To accomplish the above object, according to the present invention, there is provided a distortion-compensation amplification apparatus for compensating for distortion of a transmission signal and for amplifying and outputting the transmission signal. The distortion-compensation amplification apparatus includes a distortion compensation section for applying distortion compensation to the transmission signal; an amplification section for amplifying the transmission signal to which distortion compensation has been applied by the distortion compensation section; a frequency component calculation section for calculating the power of frequency components of the transmission signal amplified by the amplification section; and a peak suppression section for suppressing the peak value of the transmission signal input to the distortion compensation section in accordance with the power of the frequency components calculated by the frequency component calculation section.

To accomplish the above object, according to the present invention, there is also provided a distortion-compensation amplification apparatus for compensating for distortion of a transmission signal and for amplifying and outputting the transmission signal. The distortion-compensation amplification apparatus includes a coefficient storage section for storing distortion compensation coefficients at specified write addresses and outputting the distortion compensation coefficients stored at specified read addresses; a distortion compensation section for applying distortion compensation to the transmission signal by using the distortion compensation coefficients output from the coefficient storage section; and a peak suppression section for suppressing the peak value of the transmission signal input to the distortion compensation section in accordance with the distortion compensation coefficients stored in the coefficient storage section.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The present invention will be described in detail with reference to the drawings.

Figure 1:
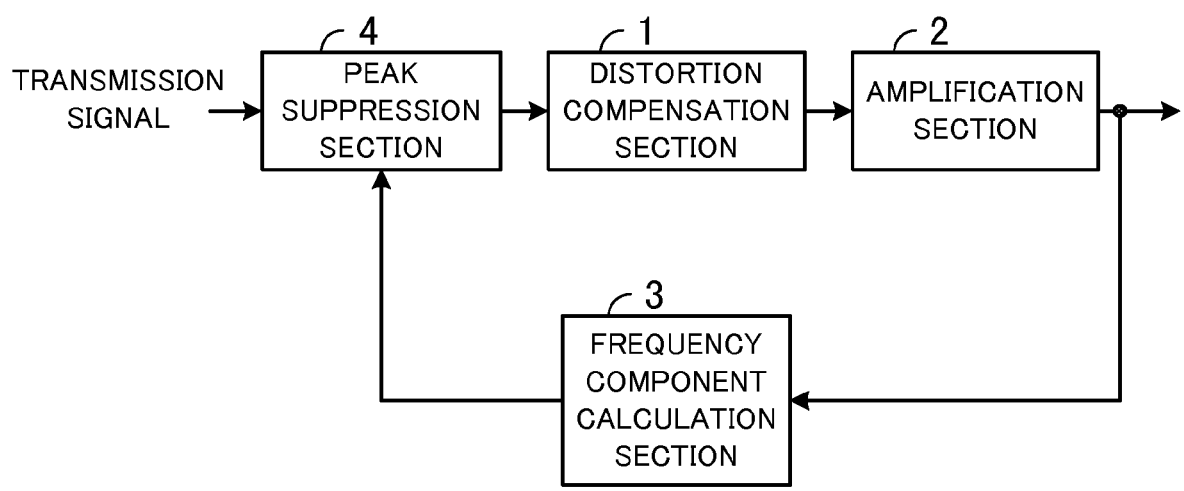
FIG. 1 is a diagrammatic sketch of a distortion-compensation amplification apparatus.

FIG. 1 shows a diagrammatic sketch of a distortion-compensation amplification apparatus. As shown in the figure, the distortion-compensation amplification apparatus includes a distortion compensation section 1, an amplification section 2, a frequency component calculation section 3, and a peak suppression section 4. The distortion-compensation amplification apparatus is installed in a base station of a wireless communication system, for instance, and compensates for distortion of a signal to be transmitted by radio to a mobile terminal and amplifies the signal.

Figure 10:
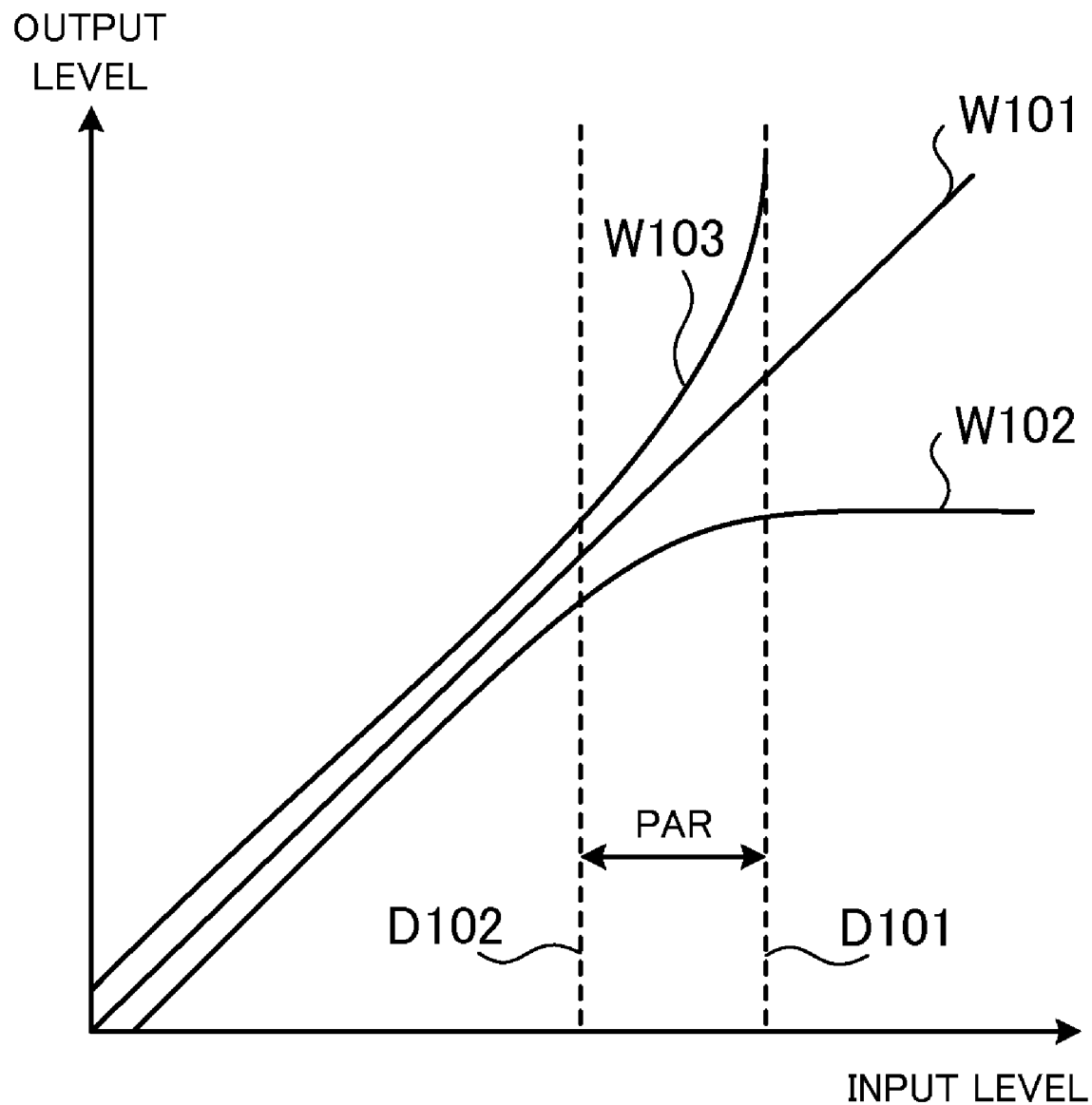
FIG. 10 illustrates amplification characteristics of a distortion-compensation amplification apparatus.
Figure 11:
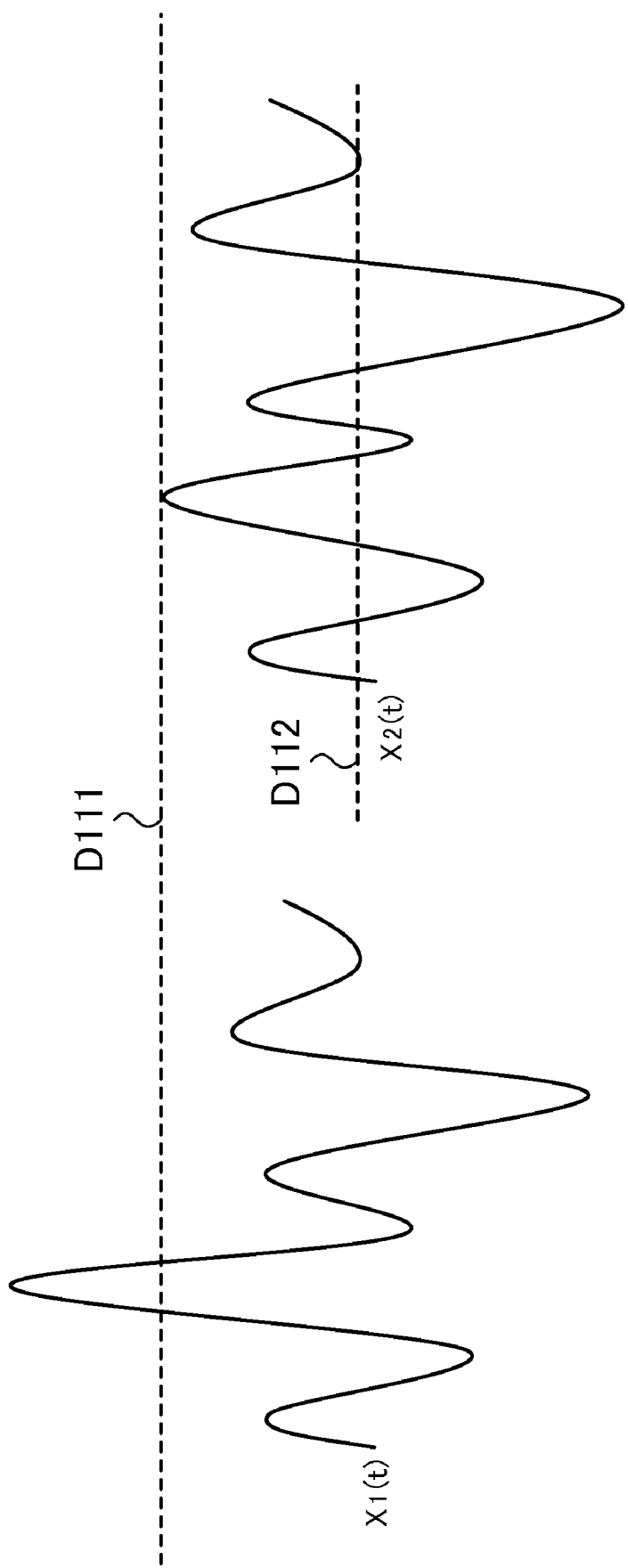
FIG. 11 illustrates peak suppression.

The distortion compensation section 1 applies distortion compensation to the transmission signal. For instance, the distortion compensation is performed to provide linearity for the amplification characteristics of the amplification section 2, as described with reference to FIG. 10.

The amplification section 2 amplifies the transmission signal of which distortion has been compensated for by the distortion compensation section 1.

The frequency component calculation section 3 calculates the power of frequency components of the transmission signal amplified by the amplification section 2. The frequency component calculation section 3 calculates the power of the frequency components of the transmission signal by Fast Fourier Transform (FFT), for example.

The peak suppression section 4 suppresses the peak value of the transmission signal input to the distortion compensation section 1 in accordance with the power of the frequency components calculated by the frequency component calculation section 3.

For example, when the power of the frequency components corresponding to the adjacent channel leakage power of the transmission signal is smaller than a prescribed threshold value, the peak suppression section 4 judges that the distortion of the transmission signal is small, and increases the value of the peak suppression point. Although this increases the distortion of the transmission signal, the error vector magnitude is improved.

In contrast, when the power of the frequency components corresponding to the adjacent channel leakage power of the transmission signal is larger than the prescribed threshold value, the distortion of the transmission signal is judged as being large, and the value of the peak suppression point is reduced. This worsens the error vector magnitude but can suppress the distortion of the transmission signal.

The distortion-compensation amplification apparatus in FIG. 1 does not fix the peak suppression point, at which the peak value of the transmission signal is suppressed, but changes the peak suppression point in accordance with the power of the frequency components of the transmission signal to control the error vector magnitude and the distortion of transmission signal, which have a tradeoff relationship, appropriately in real time. Through this operation, the distortion-compensation amplification apparatus can provide an appropriate error vector magnitude without a margin for the gain saturation point and can suppress the distortion of the transmission signal.

A first embodiment of the present invention will be described next in detail with reference to the drawings.

Figure 2:
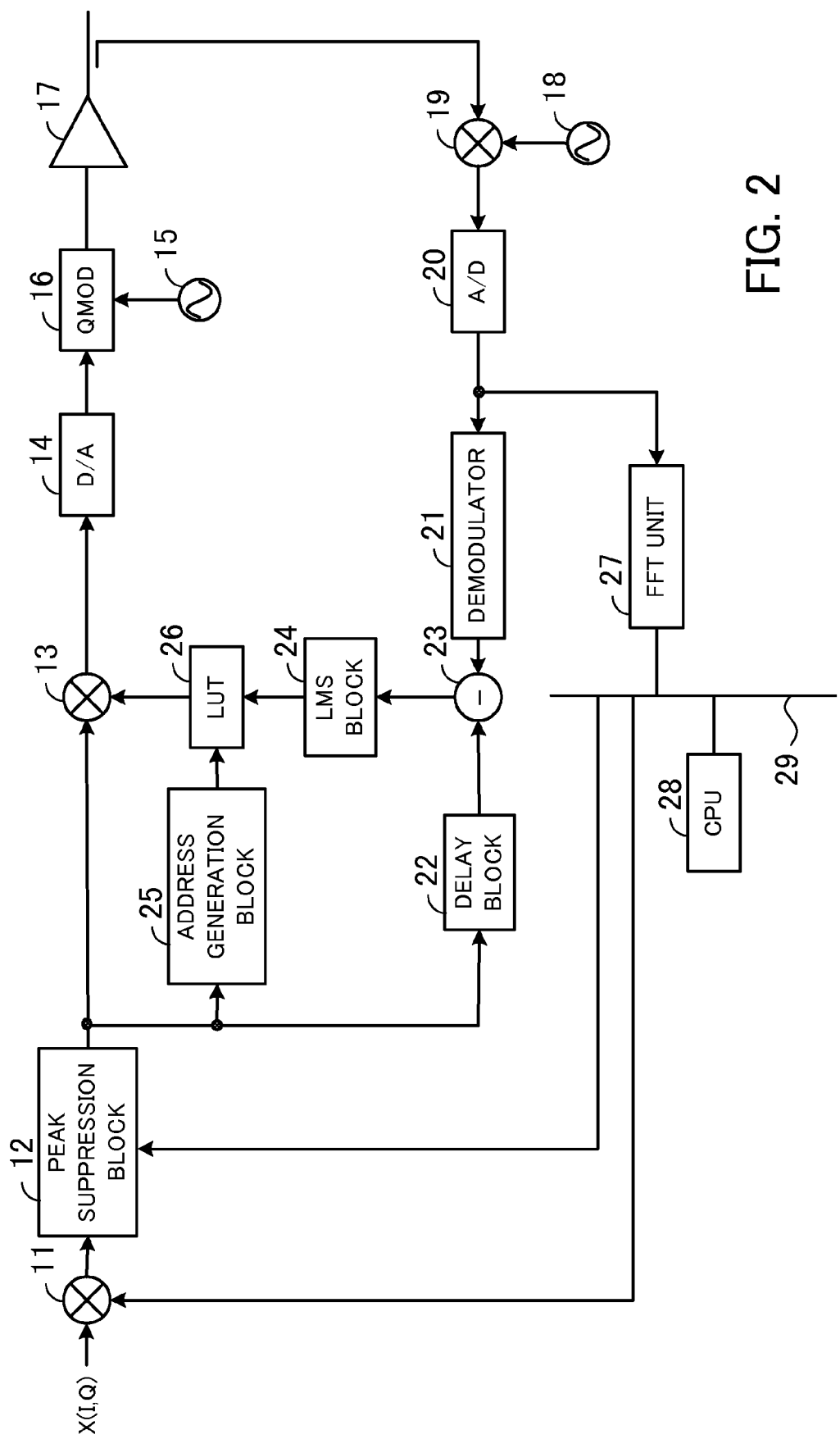
FIG. 2 is a schematic diagram of a distortion-compensation amplification apparatus of a first embodiment.

FIG. 2 shows a schematic diagram of a distortion-compensation amplification apparatus of the first embodiment. As shown in the figure, the distortion-compensation amplification apparatus includes a gain adjustment block 11, a peak suppression block 12, multipliers 13 and 19, a digital-to-analog (D/A) converter 14, oscillators 15 and 18, a quadrature modulator (QMOD) 16, a power amplifier 17, an analog-to-digital (A/D) converter 20, a demodulator 21, a delay block 22, a subtractor 23, a least mean square (LMS) block 24, an address generation block 25, a lookup table (LUT) 26, an FFT unit 27, a central processing unit (CPU) 28, and a bus 29. The shown distribution compensation amplification apparatus is used to compensate for non-linear distortion of transmitting power in a base station of a wireless communication system for mobile phones, for instance.

Baseband data X(I, Q) is input to the gain adjustment block 11, which is connected via the bus 29 to the CPU 28. Controlled by the CPU 28, the gain adjustment block 11 adjusts the gain of the baseband data X(I, Q).

The peak suppression block 12 performs peak suppression of the gain-adjusted baseband data X(I, Q). The peak suppression block 12 is connected via the bus 29 to the CPU 28, and the peak suppression point (peak suppression value) is adjusted as controlled by the CPU 28. The peak suppression block 12 keeps the baseband data X(I, Q) output from the gain adjustment block 11 below the peak suppression point specified by the CPU 28.

The address generation block 25 generates an address corresponding to the power ($I^2+Q^2$) of the baseband data X(I, Q) output from the peak suppression block 12.

The LUT 26 stores distortion compensation coefficients and outputs to the multiplier 13 the distortion compensation coefficient corresponding to the address output from the address generation block 25. The LUT 26 also stores a distortion compensation coefficient updated by the LMS block 24 at the address specified by the address generation block 25. The LUT 26 is configured by a storage device such as a random access memory (RAM).

The multiplier 13 multiplies the baseband data X(I, Q) output from the peak suppression block 12 by the distortion compensation coefficient output by the LUT 26 and outputs the result to the D/A converter 14. In other words, the multiplier 13 performs distortion compensation of the baseband data X(I, Q).

The D/A converter 14 converts the baseband data X(I, Q) to an analog baseband signal and outputs the signal to the QMOD 16.

The QMOD 16 converts the frequency of the baseband signal to a radio frequency in accordance with the signal output from the oscillator 15 and outputs the converted signal to the power amplifier 17.

The power amplifier 17 amplifies the signal output from the QMOD 16 and outputs it to an antenna, which is not shown in the figure.

Part of the output of the power amplifier 17 is input to the multiplier 19. The multiplier 19 down-converts the frequency of the signal output from the power amplifier 17 in accordance with the signal output from the oscillator 18 and outputs it to the A/D converter 20.

The A/D converter 20 converts the feedback signal output from the multiplier 19 to a digital signal and outputs the signal to the demodulator 21.

The demodulator 21 receives the digital signal, which has been modulated by the QMOD 16, from the A/D converter 20 and demodulates the signal to baseband data.

The delay block 22 delays the baseband data X(I, Q) output from the peak suppression block 12 and outputs the result to the subtractor 23. The delay block 22 is a delay filter with n taps and can delay the baseband data X(I, Q) with a precision of 1/n times the operating frequency. This can time the baseband data X(I, Q) output from the peak suppression block 12 to the delayed feedback signal.

The subtractor 23 calculates the difference between the baseband data X(I, Q) output from the delay block 22 and the feedback signal output from the demodulator 21 and outputs the difference to the LMS block 24.

The LMS block 24 updates a distortion compensation coefficient in the LUT 26 in accordance with the LMS method such that the difference output from the subtractor 23 becomes zero. The distortion-compensation amplification apparatus multiplies the input baseband data X(I, Q) with the distortion compensation coefficient stored in the LUT 26 and outputs the result to the power amplifier 17. The LMS block 24 updates the distortion compensation coefficient in the LUT 26 by the LMS adaptive signal processing such that the difference between the input baseband data X(I, Q) and the feedback signal from the power amplifier 17 becomes zero.

The FFT unit 27 applies FFT processing to the feedback signal output from the A/D converter 20. This means that the FFT unit 27 calculates the frequency components of the signal transmitted to the mobile phone.

The CPU 28 is connected via the bus 29 to the gain adjustment block 11, the peak suppression block 12, and the FFT unit 27. The CPU 28 obtains the power (adjacent channel leakage power) of the frequency components corresponding to adjacent channel leakage power from the FFT unit 27. The CPU 28 controls the gain adjustment block 11 and the peak suppression block 12 in accordance with the obtained adjacent channel leakage power.

Figure 3:
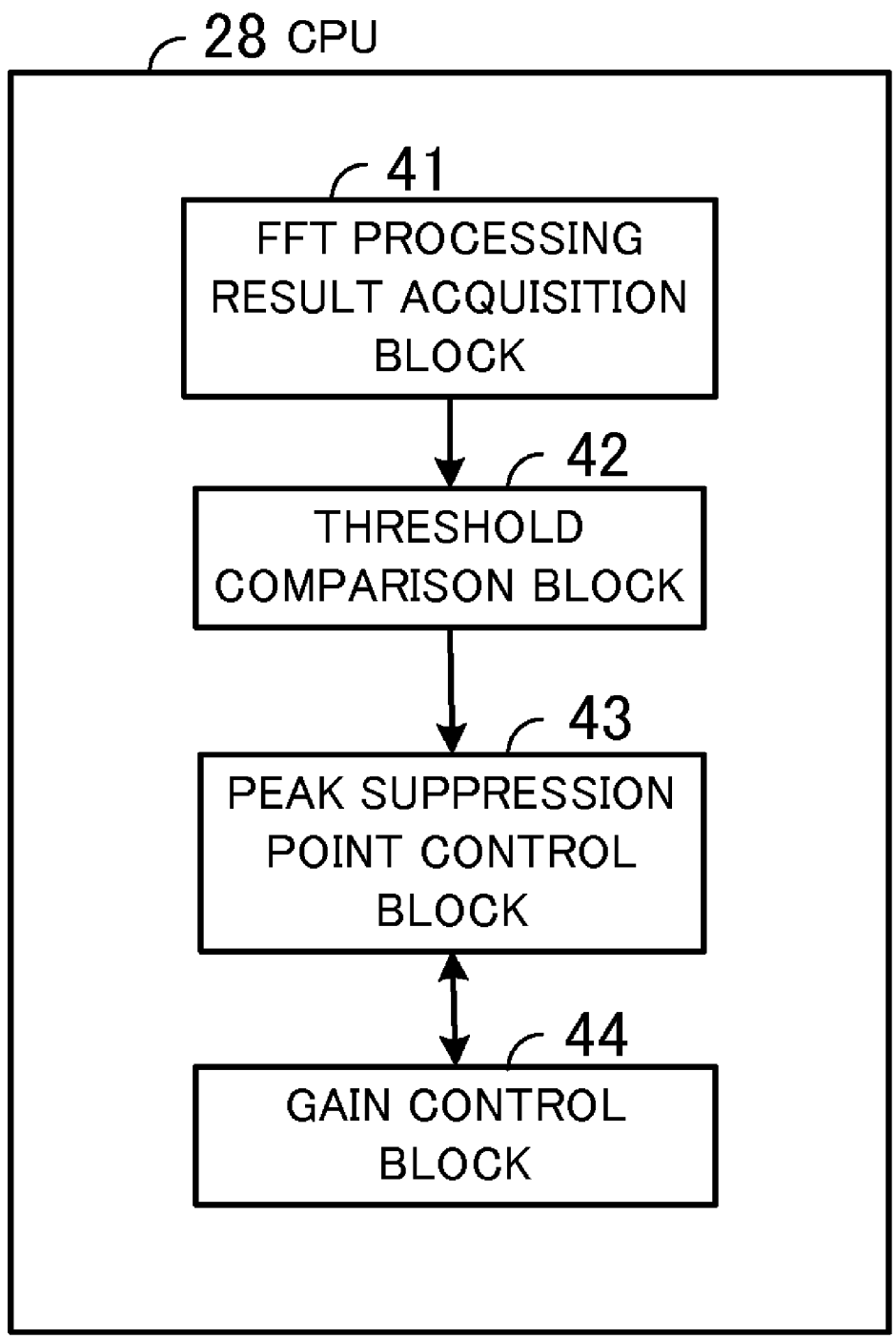
FIG. 3 is a functional block diagram of a CPU.

FIG. 3 shows a functional block diagram of the CPU 28. As shown in the figure, the CPU 28 includes an FFT processing result acquisition block 41, a threshold comparison block 42, a peak suppression point control block 43, and a gain control block 44. The CPU 28 has the shown functions in accordance with a program stored in a storage device, which is not shown in the figure.

The FFT processing result acquisition block 41 obtains the adjacent channel leakage power of the signal transmitted to the mobile phone, from the FFT unit 27.

The threshold comparison block 42 compares the adjacent channel leakage power obtained by the FFT processing result acquisition block 41 with two threshold values.

Figure 4:
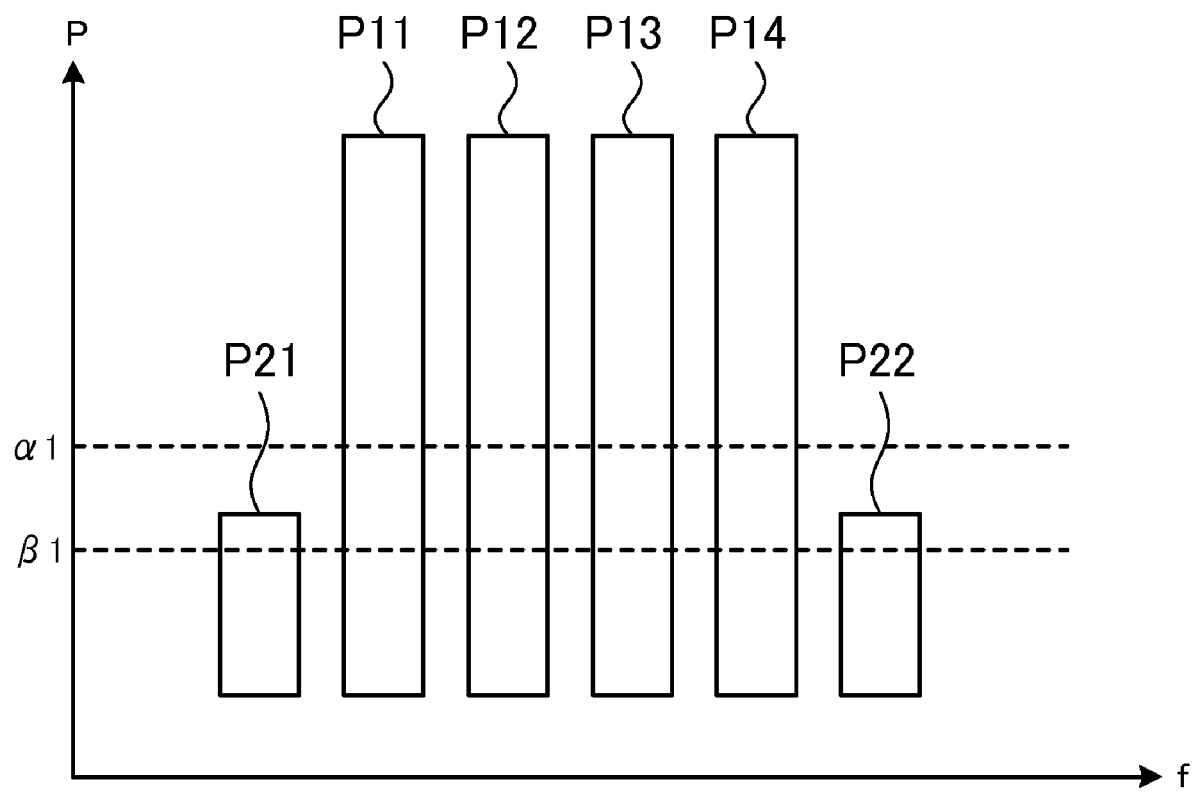
FIG. 4 illustrates threshold values.

FIG. 4 illustrates the threshold values. The figure shows the FFT processing result of the FFT unit 27. The horizontal axis represents frequency, and the vertical axis represents power. In the figure, P11 to P14 represent the power of transmission carriers, and P21 and P22 represent adjacent channel leakage power.

The threshold comparison block 42 compares the power P21 and P22 obtained from the FFT unit 27 with a prescribed upper threshold value α1 and a prescribed lower threshold value β1 (β1<α1).

The lower threshold value β1 is specified with a sufficient margin with respect to a standard adjacent channel leakage ratio (ACLR) (−45 dB). For example, the lower threshold value β1 is set to −48 dB. The upper threshold value α1 must be larger than the lower threshold value β1 and must be specified within the specifications of the standard ACLR (−45 dB). For example, the upper threshold value α1 is set to −46 dB.

The threshold comparison block 42 compares the adjacent channel leakage power P21 and P22 with the upper threshold value α1 and the lower threshold value β1 and outputs the results to the peak suppression point control block 43.

The peak suppression point control block 43 controls the peak suppression block 12 in accordance with the results of comparison by the threshold comparison block 42.

To be more specific, when it is judged that the adjacent channel leakage power P21 and P22 are smaller than the lower threshold value β1, it can be determined that the distortion in the waveform of the transmission signal is sufficiently small. Therefore, the peak suppression point control block 43 controls the peak suppression block 12 to raise the peak suppression point.

When it is judged that the adjacent channel leakage power P21 and P22 are larger than the upper threshold value α1, it can be determined that the distortion in the waveform of the transmission signal is large. Therefore, the peak suppression point control block 43 controls the operation to lower the peak suppression point.

When it is judged that the adjacent channel leakage power P21 and P22 are between the lower threshold value β1 and the upper threshold value α1, the peak suppression point control block 43 maintains the current peak suppression point.

When the distortion of the transmission signal is sufficiently small, the peak suppression point is raised to improve the error vector magnitude. If the distortion in the waveform of the transmission signal is large, the peak suppression point is lowered to reduce the distortion of the transmission signal. In other words, the distortion-compensation amplification apparatus shown in FIG. 2 changes the peak suppression point and appropriately controls the error vector magnitude and the distortion in the waveform of transmission signal, which have a tradeoff relationship, so that an optimum signal can be transmitted to the mobile phone.

The gain control block 44 monitors the peak suppression point controlled by the peak suppression point control block 43 and adjusts the gain of the gain adjustment block 11 in accordance with the peak suppression point.

To be more specific, if the peak suppression point, controlled by the peak suppression point control block 43, is below the suppression point corresponding to the lower limit γ shown in FIG. 12, the gain control block 44 controls the peak suppression point control block 43 not to output the peak suppression point to the peak suppression block 12. The gain control block 44 controls the gain adjustment block 11 to reduce the gain.

Figure 12:
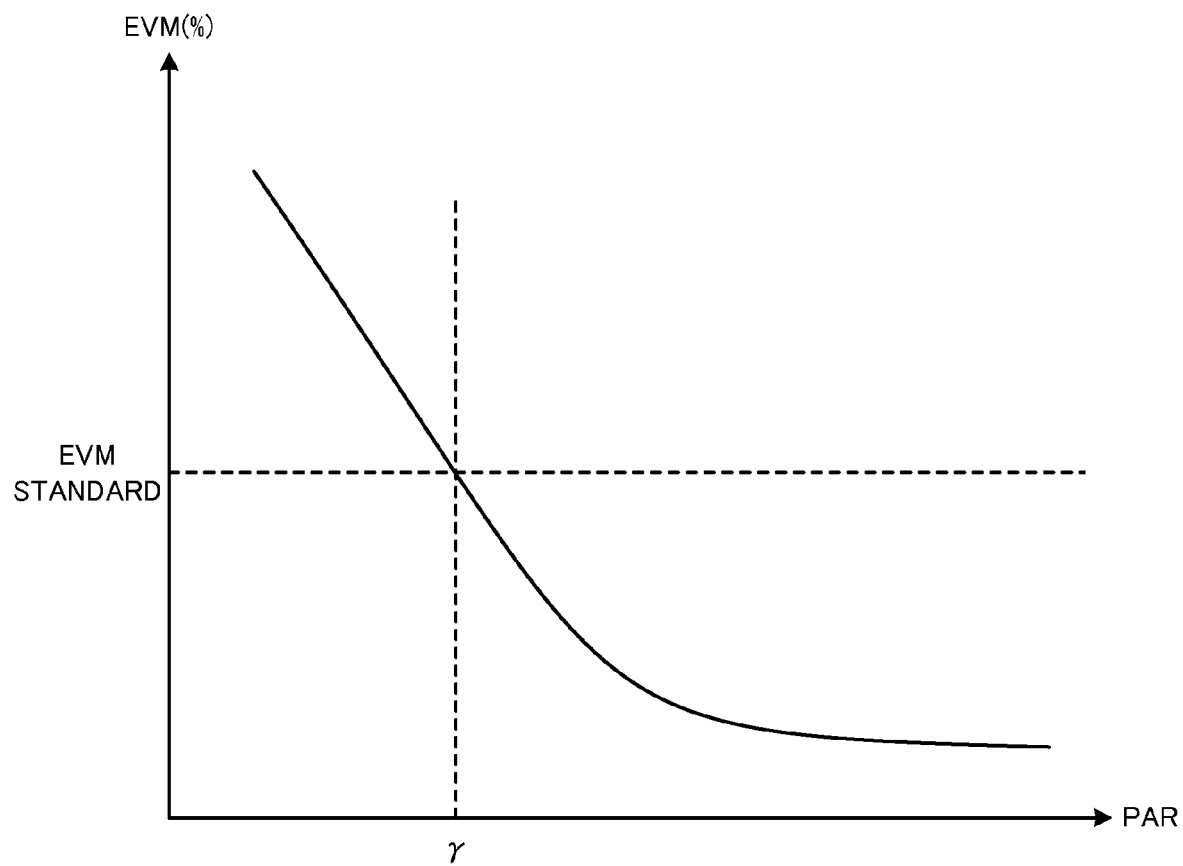
FIG. 12 shows the relationship between an error vector magnitude and peak suppression point.
Figure 13:
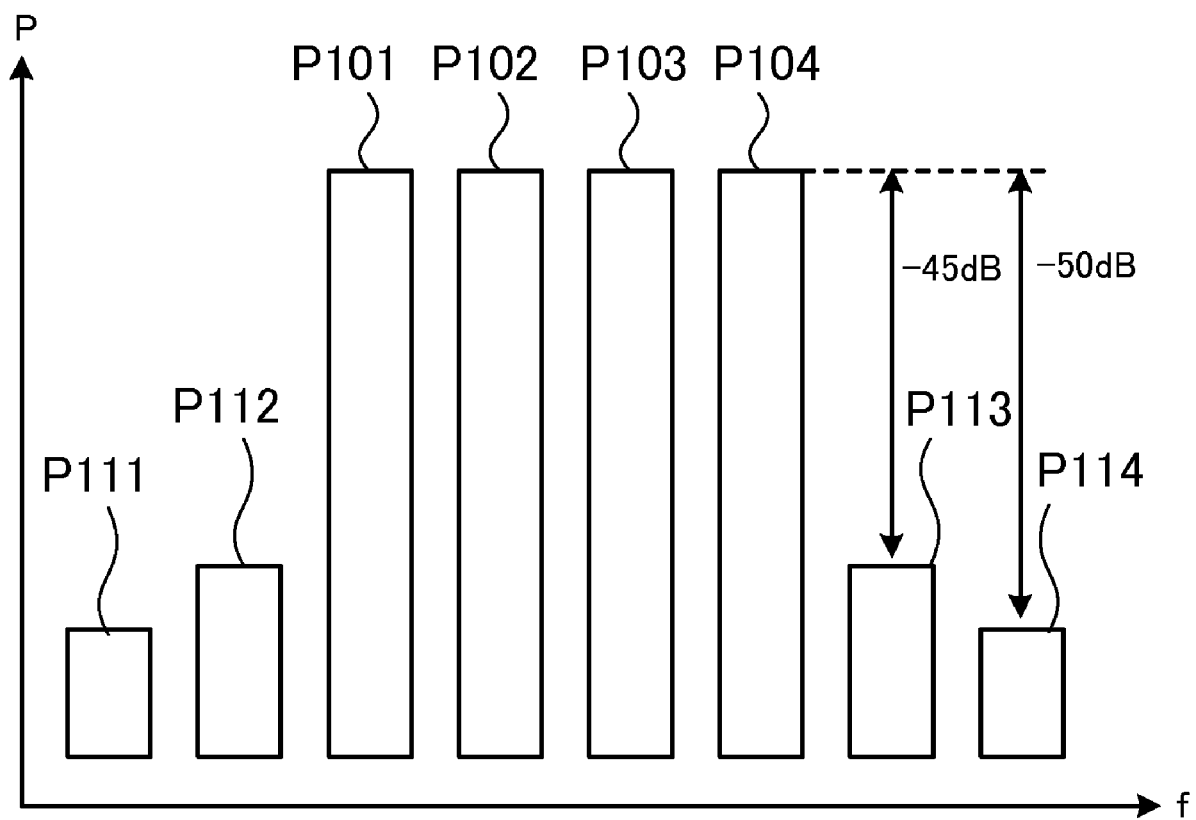
FIG. 13 illustrates adjacent channel leakage power.

Because the peak suppression point should not be smaller than the value corresponding to γ shown in FIG. 12 due to the EVM standard, the gain control block 44 reduces the gain of the baseband data X(I, Q) output to the peak suppression block 12. The gain control block 44 prevents the peak value of the baseband data X(I, Q) from exceeding the peak suppression point, by lowering the gain of the baseband data X(I, Q).

Figure 5:
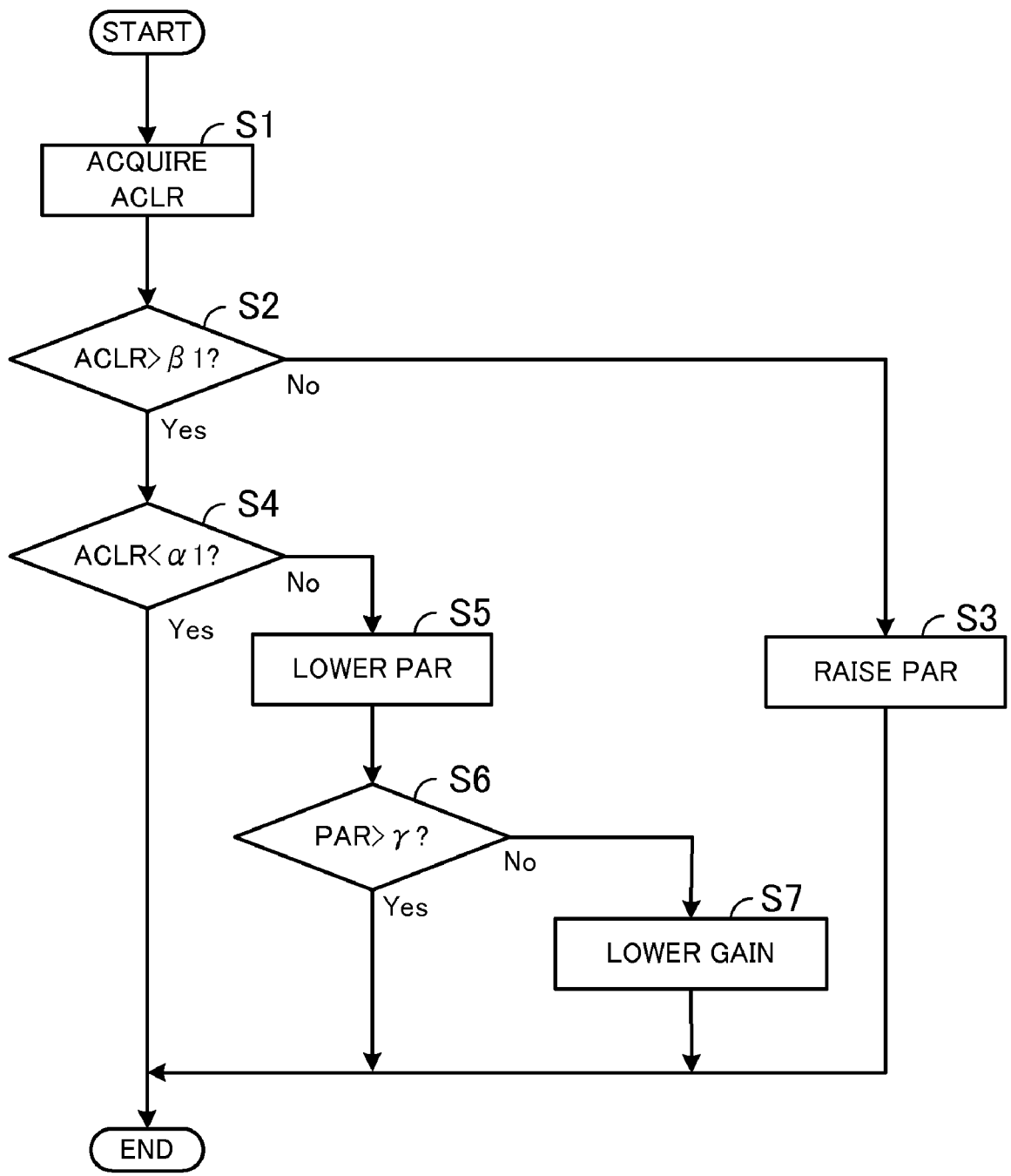
FIG. 5 is a flow chart showing the operation of the distortion-compensation amplification apparatus.

FIG. 5 is a flow chart showing the operation of the distortion-compensation amplification apparatus. When the transmission signal is output, the distortion-compensation amplification apparatus performs processing of the following steps intermittently. For example, the shown processing is performed at intervals of 60 seconds.

In step S1, the CPU 28 obtains an ACLR from the FFT unit 27.

In step S2, the CPU 28 judges whether the ACLR is larger than the lower threshold value β1. When the ACLR is larger than the lower threshold value β1, the processing proceeds to step S4. If the ACLR is not larger than the lower threshold value β1, the processing proceeds to step S3.

In step S3, the CPU 28 controls the peak suppression block 12 to raise the peak suppression point (PAR) by a predetermined value. Because distortion in the waveform of the transmission signal is sufficiently small, the CPU 28 raises the peak suppression point by the predetermined value to improve the error vector magnitude.

In step S4, the CPU 28 judges whether the ACLR is smaller than the upper threshold value α1. When the ACLR is smaller than the upper threshold value α1, the processing ends. In other words, when the ACLR is larger than the lower threshold value β1 and is smaller than the upper threshold value α1, the processing ends without changing the peak suppression point. If the ACLR is larger than or equal to the upper threshold value α1, the processing proceeds to step S5.

In step S5, the CPU 28 controls the peak suppression block 12 to lower the peak suppression point (PAR) by a given value. Because the distortion in the waveform of the transmission signal is large, the CPU 28 lowers the peak suppression point by the given value to reduce the distortion in waveform of the transmission signal.

In step S6, the CPU 28 judges whether the peak suppression point lowered in step S5 is higher than the suppression point corresponding to the lower limit value γ specified by the EVM standard. If the peak suppression point lowered in step S5 is higher than the suppression point corresponding to the lower limit value γ specified by the EVM standard, the processing ends. If the peak suppression point lowered in step S5 is not higher than the suppression point corresponding to the lower limit value γ specified by the EVM standard, the processing proceeds to step S7.

In step S7, the CPU 28 controls the gain adjustment block 11 to lower the gain of the baseband data X(I, Q). Because the peak suppression point cannot be set below γ, the CPU 28 lowers the gain of the baseband data X(I, Q) to prevent the peak value of the baseband data X(I, Q) from exceeding the peak suppression point.

The distortion-compensation amplification apparatus suppresses the peak value of the transmission signal in accordance with the adjacent channel leakage power of the transmission signal amplified by the power amplifier 17. This makes it possible to obtain an appropriate error vector magnitude without providing a margin of the gain saturation point and to suppress the distortion of the transmission signal.

In the description given above, the upper threshold value $\alpha 1$ and the lower threshold value $\beta 1$ are provided for the frequency of single adjacent channel leakage power. A plurality of upper threshold values and lower threshold values may be specified for the frequencies of a plurality of adjacent channel leakage power. For example, the upper threshold value $\alpha 1$ and the lower threshold value $\beta 1$ may be specified for leakage power at ±5 MHz from the transmission carrier frequency band, and a different upper threshold value and a different lower threshold value may be specified for leakage power at ±10 MHz from the carrier frequency band.

In the description given above, the FFT unit 27 performs FFT processing, but the CPU 28 may perform FFT processing as programmed.

A second embodiment of the present invention will now be described in detail with reference to the drawings. If the peak suppression point is specified in a gain saturation part, as described with reference to FIG. 10, the distortion compensation coefficient may diverge. In the second embodiment, the peak value of the distortion compensation coefficients is monitored, and the peak suppression point and the gain of the baseband data are controlled in accordance with the peak value.

Figure 6:
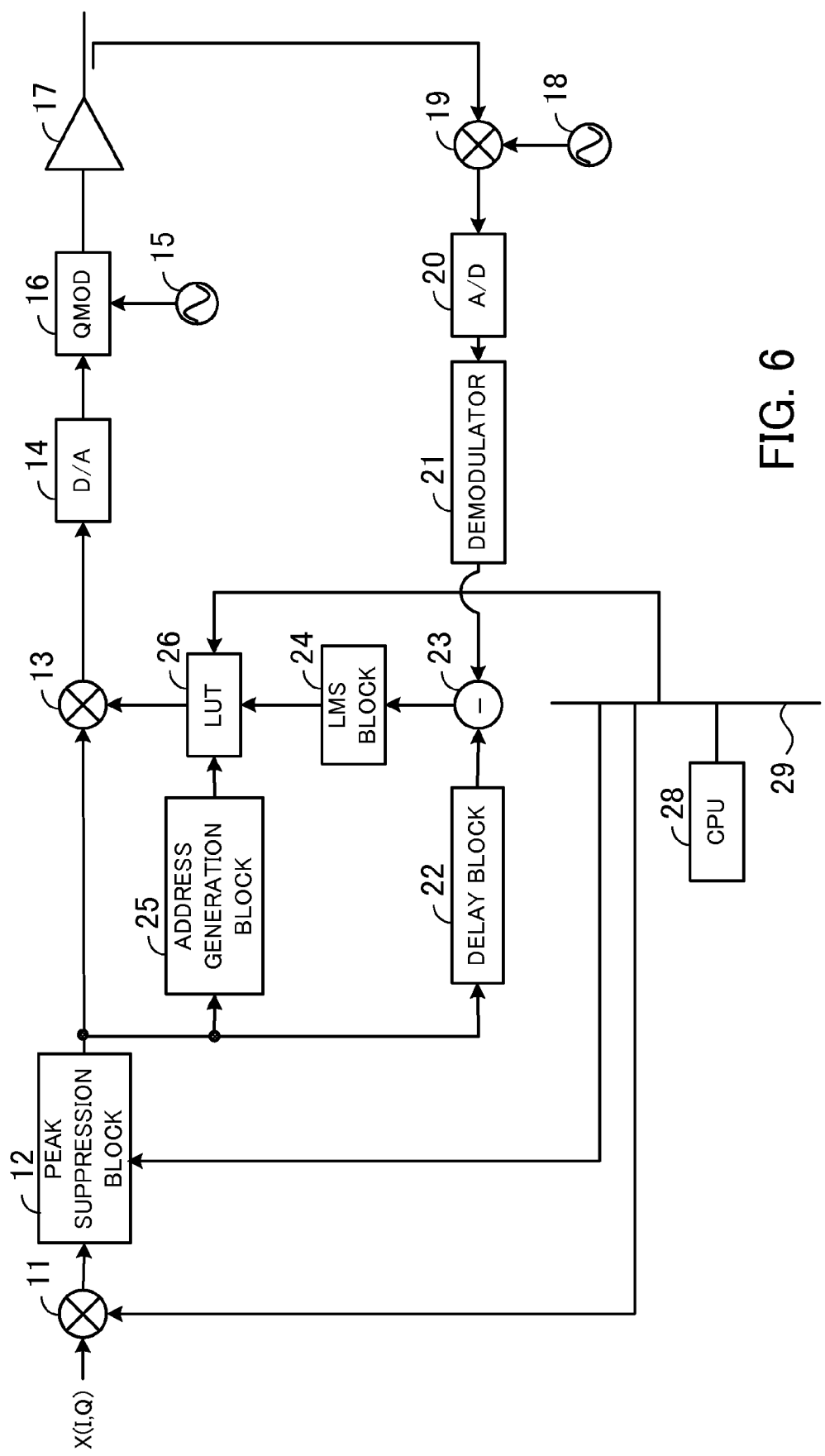
FIG. 6 is a schematic diagram of a distortion-compensation amplification apparatus of a second embodiment.

FIG. 6 is a schematic diagram of a distortion-compensation amplification apparatus of the second embodiment. In FIG. 6, components identical to those in FIG. 2 are denoted by the same reference numerals, and a description of those components will be omitted.

The distortion-compensation amplification apparatus in FIG. 6 differs from the distortion-compensation amplification apparatus in FIG. 2 in that the FFT unit 27 is not included and a CPU 28 is connected via a bus 29 to an LUT 26.

If the peak suppression point is high, when baseband data X(I, Q) at a gain saturation level is input, the distortion compensation coefficient would become an infinite value (actually a finite value) and diverge. The CPU 28 detects the peak value of distortion compensation coefficients in the LUT 26 and controls a gain adjustment block 11 and a peak suppression block 12 in accordance with the detected peak value of the distortion compensation coefficients.

Figure 7:
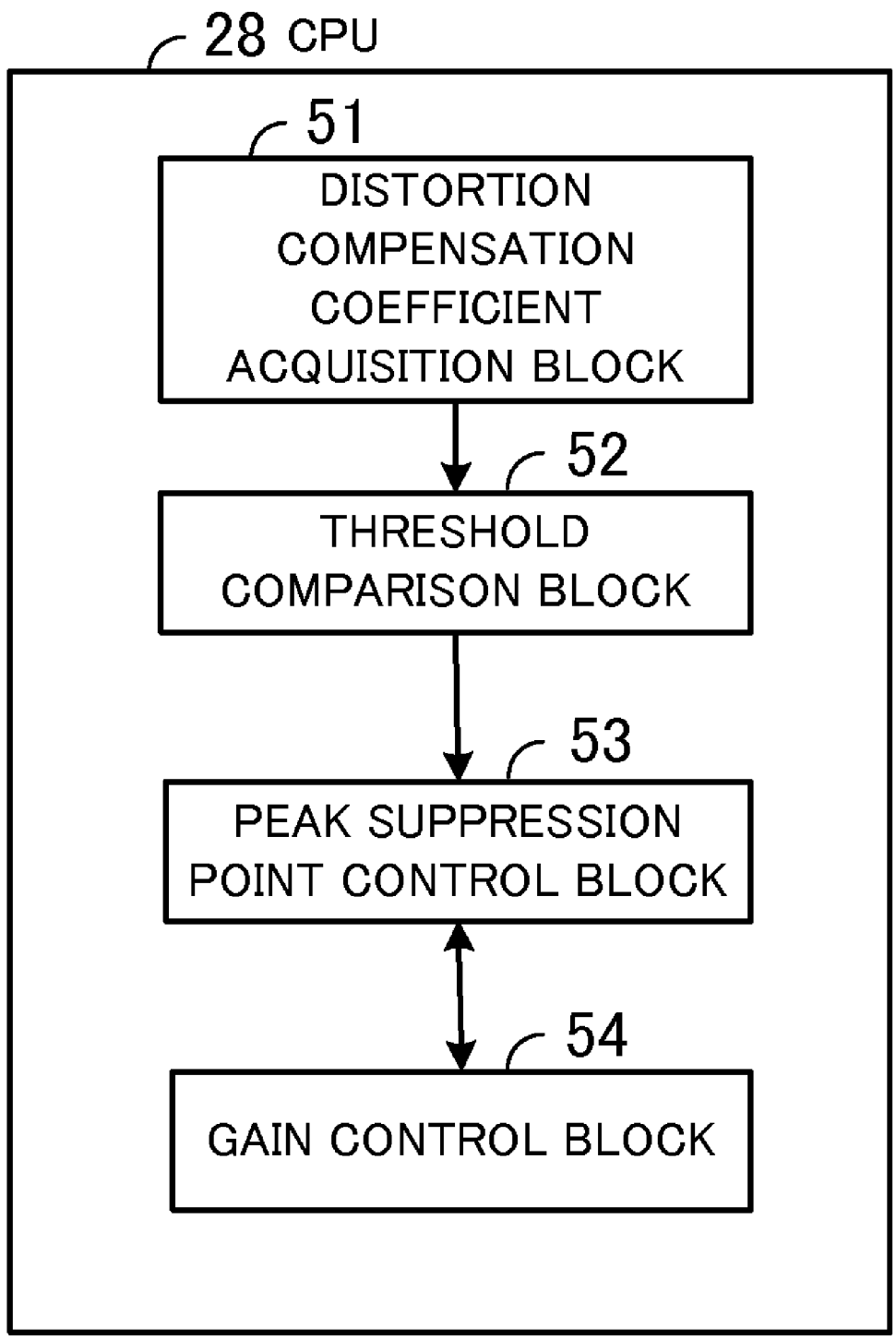
FIG. 7 is a functional block diagram of a CPU.

FIG. 7 is a functional block diagram of the CPU 28. As shown in the figure, the CPU 28 includes a distortion compensation coefficient acquisition block 51, a threshold comparison block 52, a peak suppression point control block 53, and a gain control block 54. The CPU 28 has the functions as shown in the figure in accordance with a program stored in a storage device, which is not shown in the figure.

The distortion compensation coefficient acquisition block 51 detects the peak value (maximum value) of the distortion compensation coefficients stored in the LUT 26.

The threshold comparison block 52 compares the peak value of the distortion compensation coefficients obtained by the distortion compensation coefficient acquisition block 51 with two threshold values.

Figure 8:
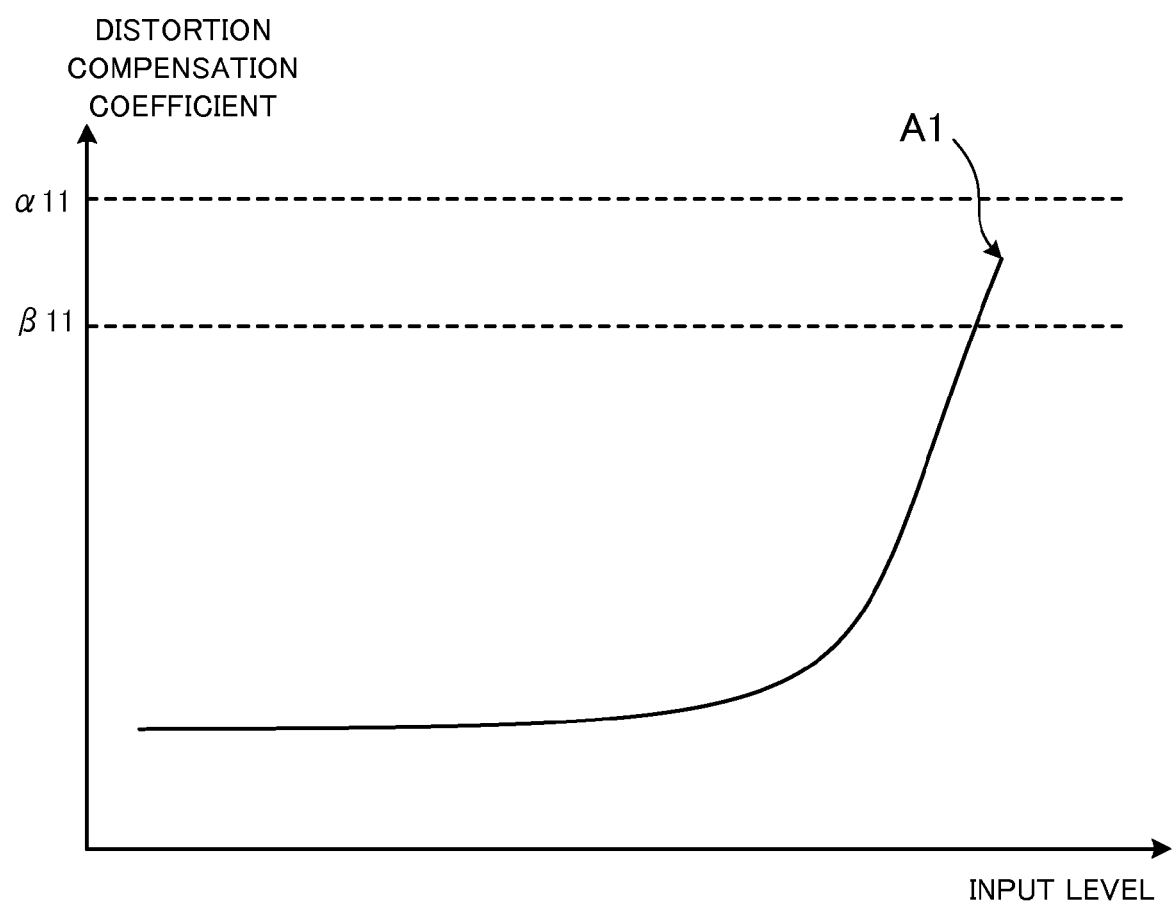
FIG. 8 illustrates the peak value of distortion compensation coefficients.

FIG. 8 illustrates the peak value of the distortion compensation coefficients. In the figure, the horizontal axis represents the input level of the baseband data X(I, Q) input to the distortion-compensation amplification apparatus, and the vertical axis represents the values of the distortion compensation coefficients in the LUT 26.

The distortion compensation coefficients have different values with the changing level of the baseband data X(I, Q) input to the distortion-compensation amplification apparatus, as shown in FIG. 8. As described with reference to FIG. 10, the gain characteristics of the power amplifier 17 become non-linear as the input level of the baseband data X(I, Q) increases and approaches the gain saturation part. The distortion compensation coefficients also have larger values as the input level of the baseband data X(I, Q) increases.

When the input level of the baseband data X(I, Q) varies as indicated in FIG. 8 in a certain period of time, the peak value of the distortion compensation coefficients is as marked by an arrow A1 in the figure. In this example, the distortion compensation coefficient acquisition block 51 obtains the value indicated by the arrow A1 in the figure as the peak value of the distortion compensation coefficients.

The threshold comparison block 52 compares the peak value of the distortion compensation coefficients obtained from the LUT 26 with a prescribed upper threshold value $\alpha 11$ and a prescribed lower threshold value $\beta 11$ ($\beta 11 < \alpha 11$).

The peak suppression point control block 53 controls the peak suppression block 12 in accordance with the results of comparison made by the threshold comparison block 52.

To be more specific, if it is judged that the peak value of the distortion compensation coefficients is larger than the upper threshold value $\alpha 11$, the peak suppression point is specified to lower the peak value below the threshold value $\alpha 11$. Specifically, the peak suppression point control block 53 controls the peak suppression block 12 to lower the peak suppression point. If the threshold comparison block 52 judges that the peak value of the distortion compensation coefficient is larger than the upper threshold value $\alpha 11$, the peak suppression point control block 53 rewrites the peak value in the LUT 26 to $\alpha 11 - \delta$. The peak value of the LUT 26 is rewritten to a value smaller than the upper threshold value $\alpha 11$. This prevents the peak value in the LUT 26 from being judged as exceeding the upper threshold value $\alpha 11$.

If the peak value of the distortion compensation coefficient is judged as being smaller than the lower threshold value $\beta 11$, the peak suppression point is specified to raise the peak value to or above the threshold value $\beta 11$. Specifically, the peak suppression point control block 53 controls the peak suppression block 12 to raise the peak suppression point.

When the peak value of the distortion compensation coefficients is larger than the lower threshold value $\beta 11$ and smaller than the upper threshold value $\alpha 11$, the peak suppression point control block 53 maintains the current peak suppression point.

If the peak value of the distortion compensation coefficients exceeds the upper threshold value $\alpha 11$, the peak suppression point is lowered to prevent the distortion compensation coefficient from diverging. If the peak value of the distortion compensation coefficient is smaller than the lower threshold value $\beta 11$, the peak suppression point is raised to improve the error vector magnitude. The distortion-compensation amplification apparatus shown in FIG. 6 changes the peak suppression point to appropriately control the error vector magnitude and the distortion of the waveform of the transmission signal, which have a tradeoff relationship, and outputs an optimum transmission signal.

The gain control block 54 monitors the peak suppression point controlled by the peak suppression point control block 53 and adjusts the gain of the gain adjustment block 11 in accordance with the peak suppression point.

To be more specific, if the peak suppression point, controlled by the peak suppression point control block 53, falls below the suppression point corresponding to the lower limit $\gamma$ shown in FIG. 12, the gain control block 54 controls the peak suppression point control block 53 not to output the peak suppression point to the peak suppression block 12. The gain control block 54 then controls the gain adjustment block 11 to reduce the gain of the gain adjustment block 11.

Since the peak suppression point should not fall below the suppression point corresponding to the value $\gamma$ shown in FIG.

12 because of the EVM standard, the gain control block 54 reduces the gain of the baseband data X(I, Q) output to the peak suppression block 12. The gain control block 54 lowers the gain of the baseband data X(I, Q), so that the peak value of the baseband data X(I, Q) will not exceed the peak suppression point.

Figure 9:
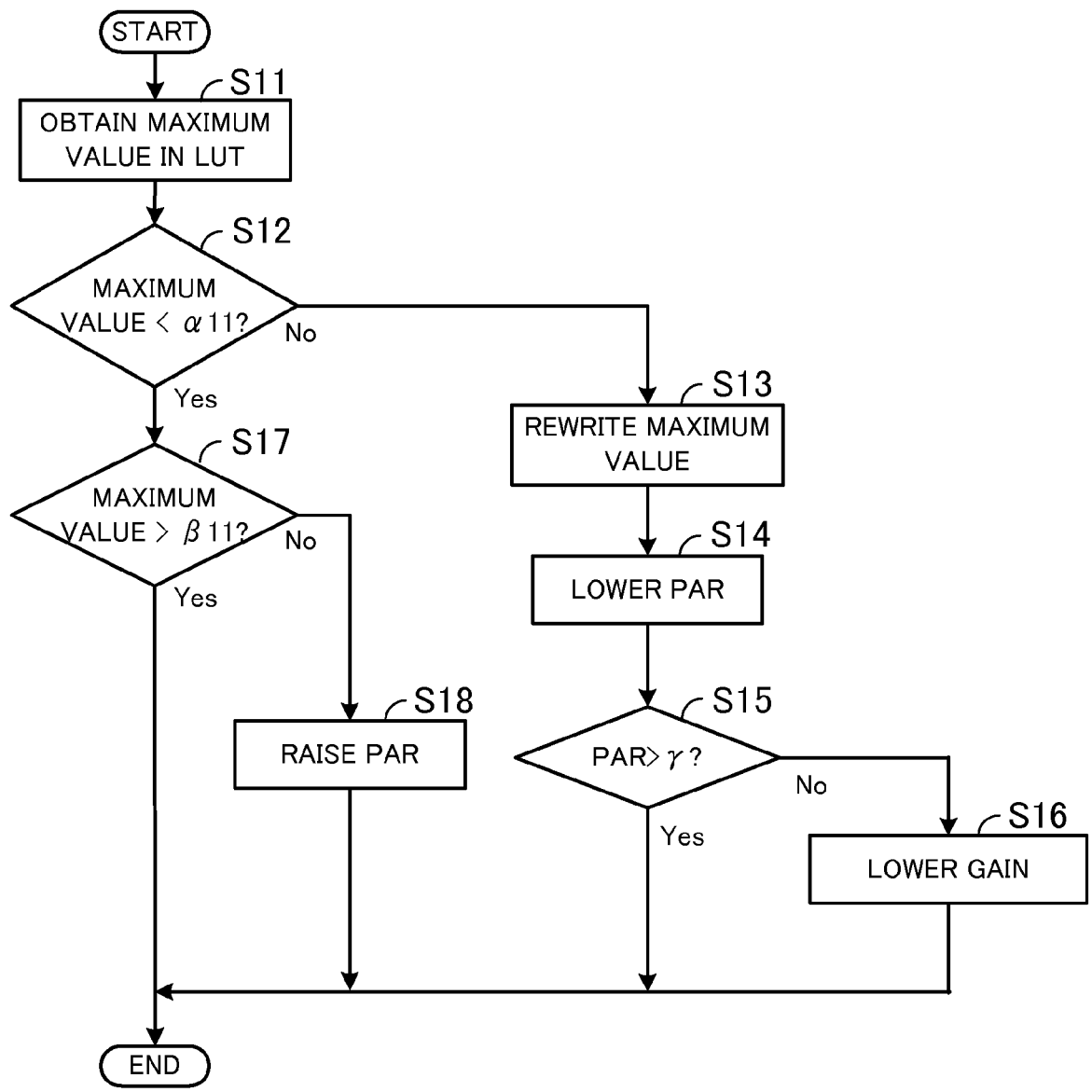
FIG. 9 is a flow chart showing the operation of the distortion-compensation amplification apparatus.

FIG. 9 is a flow chart showing the operation of the distortion-compensation amplification apparatus. When the transmission signal is output, the distortion-compensation amplification apparatus performs the processing of the following steps intermittently. For example, the shown processing is performed at intervals of 60 seconds.

In step S11, the CPU 28 obtains the maximum value of the distortion compensation coefficients from the LUT 26.

In step S12, the CPU 28 judges whether the maximum value of the distortion compensation coefficients is smaller than the upper threshold value $\alpha 11$. When the maximum value of the distortion compensation coefficients is smaller than the upper threshold value $\alpha 11$, the processing proceeds to step S17. When the maximum value of the distortion compensation coefficients is not smaller than the upper threshold value $\alpha 11$, the processing proceeds to step S13.

In step S13, the CPU 28 rewrites the maximum value of the distortion compensation coefficients in the LUT 26 to $\alpha 11 - \delta$.

In step S14, the CPU 28 controls the peak suppression block 12 to lower the peak suppression point (PAR) by a given value. Because the distortion of the waveform of the transmission signal is large, the CPU 28 lowers the peak suppression point by the given value, so that the distortion of the waveform of the transmission signal decreases.

In step S15, the CPU 28 judges whether the peak suppression point lowered in step S14 is higher than the suppression point corresponding to the lower limit $\gamma$ stipulated by the EVM standard. When the peak suppression point lowered in step S14 is higher than the suppression point corresponding to the lower limit $\gamma$ stipulated by the EVM standard, the processing ends. If the peak suppression point lowered in step S14 is not higher than the suppression point corresponding to the lower limit $\gamma$ stipulated by the EVM standard, the processing proceeds to step S16.

In step S16, the CPU 28 controls the gain adjustment block 11 to decrease the gain of the baseband data X(I, Q). Because the peak suppression point cannot be set below $\gamma$, the CPU 28 lowers the gain of the baseband data X(I, Q), so that the peak value of the baseband data X(I, Q) will not exceed the peak suppression point.

In step S17, the CPU 28 judges whether the maximum value of the distortion compensation coefficients is larger than the lower threshold value $\beta 11$. When the maximum value of the distortion compensation coefficients is larger than the lower threshold value $\beta 11$, the processing ends. When the maximum value of the distortion compensation coefficients is larger than the lower threshold value $\beta 11$ and smaller than the upper threshold value $\alpha 11$, the processing ends without changing the peak suppression point. If the maximum value of the distortion compensation coefficients is not larger than the lower threshold value $\beta 11$, the processing proceeds to step S18.

In step S18, the CPU 28 controls the peak suppression block 12 to raise the peak suppression point (PAR) by a given value. Because the distortion of the waveform of the transmission signal is sufficiently small, the CPU 28 raises the peak suppression point to improve the error vector magnitude.

The distortion-compensation amplification apparatus reduces the peak value of the transmission signal in accordance with the peak value of the distortion compensation coefficients in the LUT 26. This allows an appropriate error vector magnitude to be obtained without providing a margin for the gain saturation point and also allows the distortion of the transmission signal to be suppressed.

The distortion-compensation amplification apparatus of the present invention calculates the power of the frequency components of the amplified transmission signal and suppresses the peak value of the transmission signal in accordance with the calculated power of the frequency components of the transmission signal. Because the amplifier can be used without a margin, an appropriate error vector magnitude can be obtained without increasing power consumption, and the distortion of the transmission signal can be suppressed.

Another distortion-compensation amplification apparatus of the present invention suppresses the peak value of the transmission signal in accordance with the distortion compensation coefficients used to compensate for the distortion of the transmission signal. This allows an appropriate error vector magnitude to be obtained without increasing the power consumption and also allows the distortion of the transmission signal to be suppressed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A distortion-compensation amplification apparatus for compensating for distortion of a transmission signal and for amplifying and outputting the transmission signal, the distortion-compensation amplification apparatus comprising:
   a distortion compensation unit to apply distortion compensation to the transmission signal;
   an amplification unit to amplify the transmission signal to which distortion compensation has been applied by the distortion compensation unit;
   a frequency component calculation unit to calculate power of individual frequency components of the transmission signal amplified by the amplification unit; and
   a peak suppression unit to suppress a peak value of the transmission signal input to the distortion compensation unit in accordance with the power of a frequency component selected from among the individual frequency components whose power has been calculated by the frequency component calculation unit.

2. The distortion-compensation amplification apparatus according to claim 1, wherein the peak suppression unit compares the power of a frequency component corresponding to adjacent channel leakage power among the frequency components with an upper threshold value and a lower threshold value smaller than the upper threshold value, and suppresses the peak value of the transmission signal accordingly.

3. The distortion-compensation amplification apparatus according to claim 2, wherein the peak suppression unit raises a suppression point where the peak value is suppressed if the power is smaller than the lower threshold value, and lowers the suppression point if the power is larger than the upper threshold value.

4. The distortion-compensation amplification apparatus according to claim 1, wherein the high-frequency component selected from among the individual frequency components is a frequency component corresponding to adjacent channel leakage power of the transmission signal.

5. A distortion compensation method for a distortion-compensation amplification apparatus for compensating for distortion of a transmission signal and for amplifying and outputting the transmission signal, the distortion compensation method comprising:

applying distortion compensation to the transmission signal;

amplifying the transmission signal to which distortion compensation has been applied;

calculating power of individual frequency components of the amplified transmission signal; and suppressing a peak value of the transmission signal in accordance with the power of a frequency component selected from among the individual frequency components whose power has been calculated.

6. A distortion-compensation amplification apparatus for compensating for distortion of a transmission signal and for amplifying and outputting the transmission signal, the distortion-compensation amplification apparatus comprising:

a coefficient storage unit to store distortion compensation coefficients at specified write addresses and outputting the distortion compensation coefficients stored at specified read addresses;

a distortion compensation unit to apply distortion compensation to the transmission signal by using the distortion compensation coefficients output from the coefficient storage unit; and a peak suppression unit to suppress a peak value of the transmission signal input to the distortion compensation unit in accordance with a result of comparison of a maximum value of the distortion compensation coefficients stored in the coefficient storage unit with an upper threshold value and a lower threshold value smaller than the upper threshold value.

7. The distortion-compensation amplification apparatus according to claim 6, wherein the peak suppression unit lowers a suppression point where the peak value is suppressed if the maximum value of the distortion compensation coefficients is larger than the upper threshold value and raises the suppression point if the maximum value of the distortion compensation coefficients is smaller than the lower threshold value.

8. The distortion-compensation amplification apparatus according to claim 7, further comprising a gain control unit for lowering a gain of the transmission signal input to the distortion compensation unit if the lowered suppression point is smaller than a prescribed value.

9. A distortion compensation method for a distortion-compensation amplification apparatus for compensating for distortion of a transmission signal and for amplifying and outputting the transmission signal, the distortion compensation method comprising:

applying distortion compensation to the transmission signal by using distortion compensation coefficients output from a coefficient storage unit for storing the distortion compensation coefficients at specified write addresses and outputting the distortion compensation coefficients stored at specified read addresses;

comparing a maximum value of the distortion compensation coefficients stored in the coefficient storage unit with an upper threshold value and a lower threshold value smaller than the upper threshold value; and suppressing a peak value of the transmission signal in accordance with a result of said comparing.

* * * * *